US012743573B1

(12) United States Patent
Ding et al.

(10) Patent No.: US 12,743,573 B1
(45) Date of Patent: Sep. 22, 2026

(54) BALANCING BUFFER INSERTION FOR CLOCK H-TREES

(71) Applicant: Cadence Design Systems, Inc., San Jose, CA (US)

(72) Inventors: Yi-Xiao Ding, Austin, TX (US); Zhuo Li, Austin, TX (US); Charles Jay Alpert, Cedar Park, TX (US)

(73) Assignee: Cadence Design Systems, Inc., San Jose, CA (US)

( * ) Notice: Subject to any disclaimer, the term of this patent is extended or adjusted under 35 U.S.C. 154(b) by 718 days.

(21) Appl. No.: 18/141,235

(22) Filed: Apr. 28, 2023

(51) Int. Cl.
*G06F 30/396* (2020.01)
*G06F 30/347* (2020.01)

(52) U.S. Cl.
CPC .......... *G06F 30/396* (2020.01); *G06F 30/347* (2020.01)

(58) Field of Classification Search
USPC .......................................................... 716/113
See application file for complete search history.

(56) References Cited

U.S. PATENT DOCUMENTS

2007/0044054 A1* 2/2007 Matsuo .................. G06F 30/30 250/214 R

* cited by examiner

*Primary Examiner* — Bryce M Aisaka
(74) *Attorney, Agent, or Firm* — Schwegman Lundberg & Woessner, P.A.

(57) ABSTRACT

Aspects of the present disclosure include system, methods, and software for creating an H-tree routing layout. In one example, a method includes an H-tree routing layout that has a plurality of vertical traces and horizontal traces connecting a clock source to a plurality of clock sinks. The method positions a plurality of candidate buffers in the H-tree routing layout. The method assigns a 4-dimensional (4D) vector to each candidate buffer of the plurality of candidate buffers, and derives one or more merge buffer combinations from the plurality of candidate buffers based on the assigned 4D vector of at least two candidate buffers of the plurality of candidate buffers. The method also applies a threshold vector to select one or more final candidate buffers from the merge buffer combinations.

20 Claims, 8 Drawing Sheets

400

418
FF
448
446
444
414
FF
406
442
440
438
434
436
432
FF
416
408
430
428
426
450
412
FF
404
424
422
420
402
410

BALANCING BUFFER INSERTION FOR CLOCK H-TREES

TECHNICAL FIELD

The present disclosure generally relates to the technical field of integrated circuit clock H-trees. In particular, the present disclosure addresses balancing buffer insertion for clock H-trees.

BACKGROUND

An integrated circuit (IC) clock transmits a periodic signal used by various components of the IC. An H-tree is an interconnection topography between certain clock sources and clock sinks. The H-tree distributes signals from clock sources into clock sinks across a clock signal network.

BRIEF DESCRIPTION OF THE SEVERAL VIEWS OF THE DRAWINGS

Various ones of the appended drawings merely illustrate example embodiments of the present inventive subject matter and cannot be considered as limiting its scope.

DETAILED DESCRIPTION

Figure 1:
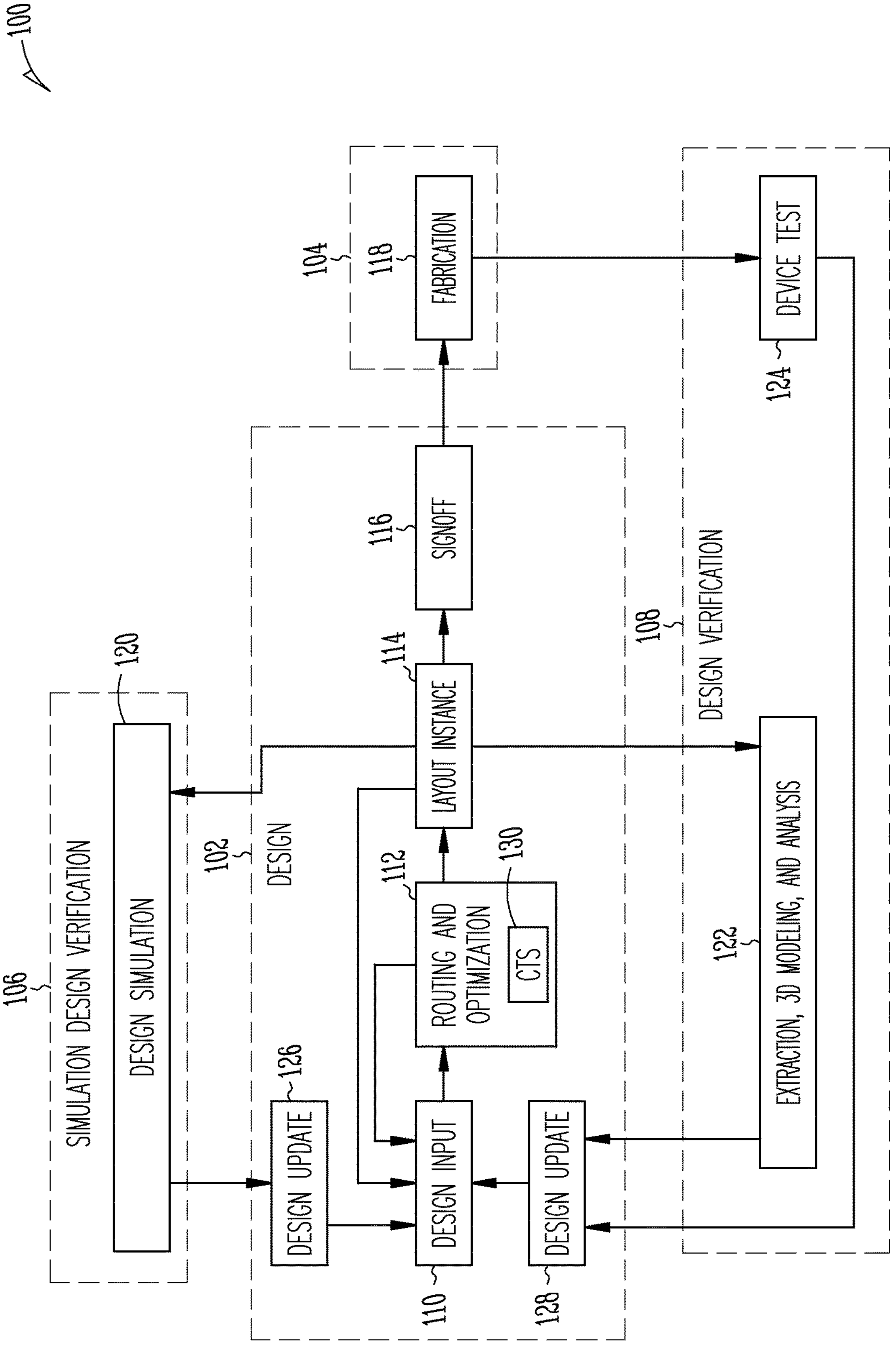
FIG. 1 illustrates an example IC design process flow, according to some embodiments.

Reference will now be made in detail to specific example embodiments for carrying out the inventive subject matter. Examples of these specific embodiments are illustrated in the accompanying drawings, and specific details are set forth in the following description in order to provide a thorough understanding of the subject matter. It will be understood that these examples are not intended to limit the scope of the claims to the illustrated embodiments. On the contrary, they are intended to cover such alternatives, modifications, and equivalents as may be included within the scope of the disclosure.

Certain integrated circuit IC devices include clock signals that are transmitted throughout an IC device for various purposes, such as data transmission, signal synchronization, coordinating a sequence of actions, and so on. The IC device includes one or more clock sources, such as crystal oscillators, clock generators, and the like, that produce an oscillating signal at a desired oscillation frequency. The oscillating signal is then distributed from the one or more clock sources to one or more clock sinks via a clock signal network. For example, the clock sinks include registers or flip-flops that can store information, e.g., clock pulse information. In a circuit using edge-triggered registers, when a clock edge arrives at a register, the register transfers the register input to the register output, and these new register output values flow through combinational logic built into the IC device to provide the values at register inputs for the next clock edge or tick. It is desirable for the clock signal received as input to each clock sink register reaches its final value in time for the next clock tick so that the behavior of the whole circuit is more reliable and predictable.

During a physical design portion of an IC design process, certain structures are placed at various physical locations of the IC device die. For example, during floor planning, certain structures are placed close together, space is allocated for the structures to meet desired performance goals, and the placement considers die area to attempt to minimize wasted space. Clock sources are placed and then routed to clock sinks. In some examples, a clock tree synthesis (CTS) process is used to more efficiently route the clock sources to the clock sinks, for example, by using an H-tree routing layout having multiple buffers and/or inverting buffers. The H-tree routing layout is so named because of its visual semblance to the Latin alphabet letter "H", as described in more detail below. The CTS process creates the H-tree routing layout and inserts buffers in the various locations of H-tree routing layout to minimize skew, e.g., a difference in clock arrival time at two or more different registers, and additionally to meet a target insertion delay, e.g., a desired amount of time taken by a clock signal to travel from a clock source to clock sinks. As used herein, the term "buffer" refers to both a standard buffer whose output value mirrors its input value and to an inverting buffer (e.g., an inverter) whose input value is a logical opposite of its output value.

The techniques described herein use a capacitance threshold, a cost threshold, and a level threshold to more efficiently balance buffer insertions during the creation of the H-tree routing layout. Buffer insertions are also referred to as bufferings. In some examples, buffer candidates are generated via dynamic programming techniques using a bottom-up approach, e.g., starting at clock sinks and moving up towards clock sources. Branch node buffer candidates are then evaluated for merging buffer candidates in downstream branches by using the capacitance threshold, the cost threshold, and the level threshold. By evaluating the buffer candidates using the various thresholds, a more balanced allocation between buffer candidates is achieved. For example, buffer candidates that have a larger capacitance difference between each other may not be merged based on the threshold evaluations, even though individual buffer candidates may show reduced timing slack when compared to other buffer candidates. Selected buffer candidates resulting from a merge process are then pruned via a three-dimensional (3D) operation, resulting in a more balanced allocation of buffers throughout the H-tree routing layout, as further described below. The resulting H-tree routing layout then offers improved overall skew metrics and added robustness.

It may be beneficial to illustrate an example IC design process flow that incorporates the techniques described herein. Turning now to FIG. 1, the figure is a block diagram illustrating an example IC design process flow 100 that includes net partitioning and layer-based parasitic extraction, according to some examples. As shown, the IC design process flow 100 includes a design phase 102, a device fabrication phase 104, a simulation design verification phase 106, and a design verification phase 108. The design phase 102 involves an initial design input operation 110 where the basic elements and functionality of a device are determined, as well as revisions based on various analyses and optimization of a circuit design. This design input operation 110 is where block (e.g., functional) instances are used in the circuit design and any additional circuitry for the design around the blocks is selected. For example, a variety of electronic components such as amplifiers, registers, signal generators, and so on, may be provided as blocks to be used for a given device, e.g., radio frequency (RF) device. The initial strategy, tactics, and context for the device to be created are also generated in the design input operation 110 operation, depending on the particular design algorithm to be used.

In some embodiments, following an initial selection of design values in the design input operation 110, routing, timing analysis, and optimization are performed in a routing and optimization operation 112 operation, along with any other automated design processes. While the design process flow 100 shows the routing and optimization operation 112 occurring prior to a layout instance 114, routing, timing analysis, and optimization may be performed at any time to verify operation of a circuit design. For instance, in various examples, timing analysis in a circuit design may be performed prior to routing of connections in the circuit design, after routing, during register transfer level (RTL) operations, or as part of a signoff 116 as described below.

The routing and optimization operation 112 includes deriving various interconnections or routes between, for example, devices, pins, networks, layers, and so on. Accordingly, connection paths between pins and other components are generated as part of the routing and optimization operation 112. After design inputs are used in the design input operation 110 to generate a circuit layout and the routing and optimization operation 112 is performed, a layout is generated in the layout instance 114. The layout describes the physical layout dimensions of the device that match the design inputs. The layout instance 114 also includes one or more layers, e.g., metal layers, that define interconnections and components for each layer. Prior to the layout instance 114 being provided to a fabrication operation 118, the signoff 116 is performed on the circuit design defined by the layout instance 114. The signoff 116 includes verification steps that the layout instance 114 passes before being sent for manufacture.

After signoff verification via the signoff 116, a verified version of the layout instance 114 is used in the fabrication operation 118 to manufacture a device. Additional testing and design updates 126, 128 may be performed using designer inputs or automated updates based on design simulation operation 120 operations, or via extraction, three-dimensional (3D) extraction, 3D modeling, and analysis operations 122. Once the device is generated, the device can be tested as part of device test 124 operations and layout modifications generated based on actual device performance.

In the illustrated example, a clock tree synthesis process 130 is shown. The clock tree synthesis process 130 creates certain layouts, e.g., H-tree routing layouts, for the distribution of a clock signal among sequential parts (e.g., sequential logic parts) of the IC design process flow 100. buffers are additionally placed at various locations of an H-tree routing layout to minimize skew of the clock signal, to meet a target insertion delay, and to improve robustness of the layout. For example, by using an H-tree routing layout, cross-corner scaling is better balanced, where clock sources at corners of the layout receive the clock signal with minimal or no delay. The H-tree routing layout also improves on power usage when compared to, for example, a mesh layout. Accordingly, a more efficient clock signal network is provided.

The H-tree routing layout is improved by adding buffers throughout to enhance the balancing of clock signal transmission and to fix design rule violations (e.g., referred to as DRV fixing). The techniques described herein insert buffers through at the layout and then begin a bottom-up (e.g., clock sink side) navigation of the H-tree routing layout. When a branch node is encountered, a merging of buffer candidate combinations use a threshold vector approach that incorporates comparing a 3D threshold vector that includes a capacitance difference, a cost difference, and level difference for a merge candidate combination against certain thresholds to better balance placement of two or more buffer candidates. Based on the threshold comparison, the buffer candidates included in the merge combination either pass and remain candidates or are removed.

A pruning operation is then performed on remaining or final candidates via a second 3D vector that includes capacitance, timing slack, and cost values for each candidate. In certain examples, the pruning operation finds final candidate buffers that have the same or higher cost values and then discards those found final candidate buffers that have larger timing slack or larger capacitance values. Those remaining candidate buffers that have not been pruned are then placed in the final H-tree routing layout, for example, to be used during the manufacturing of a clock signal network having the H-tree routing layout.

Figure 2:
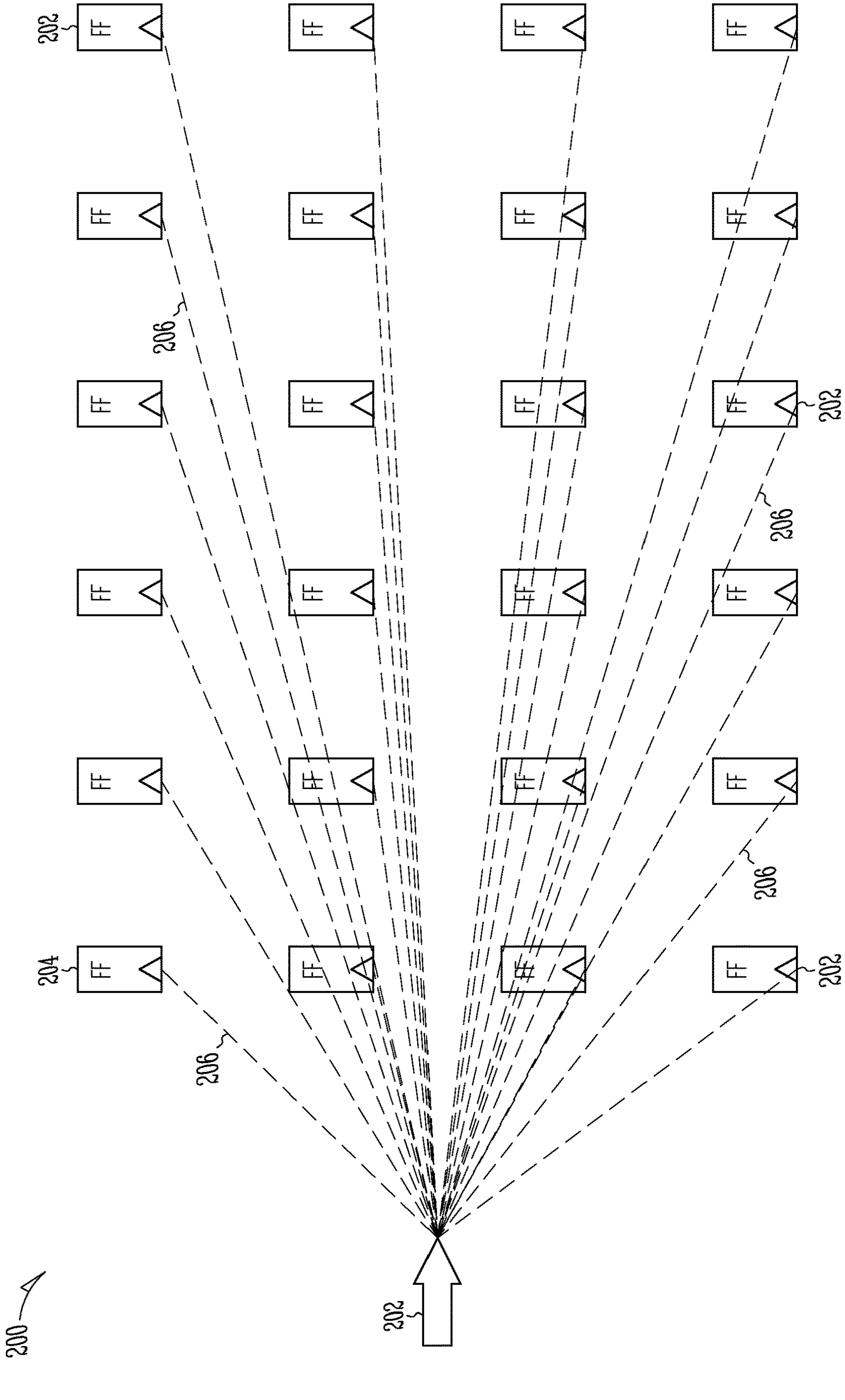
FIG. 2 illustrates an example circuit layout having a clock source and multiple clock sinks, according to some embodiments.

It may be beneficial to illustrate an example circuit layout that incorporates a clock source and various clock sinks as part of a clock signal network. Turning now to FIG. 2, the figure illustrates an example circuit layout 200 having a clock source 202 electrically coupled to multiple clock sinks 204, e.g., flip-flops, according to some examples. More specifically, the clock source 202 illustrated in the figure is directly connected to the clock sinks 204 via direct paths 206. The resulting circuit layout 200, however, results in the clock sinks receiving a clock signal transmitted by the clock source 202 at different times, due, for example, to the different locations of the clock sinks 204 relative to the clock source 202. Clock sinks 204 closer to the clock source 202 will receive the clock signal before clock sources farther away from the clock source 202, resulting in unwanted skew and insertion delays. For example, resistance-capacitance (RC) variations among the direct path 206 caused by resistance and capacitance of traces along the direct paths 206 will in turn create skew and insertion delays. Additionally, RC and length variations of the direct paths 206 can result in jitter issues, clock signal integrity issues, noise issues, and so on.

Figure 3:
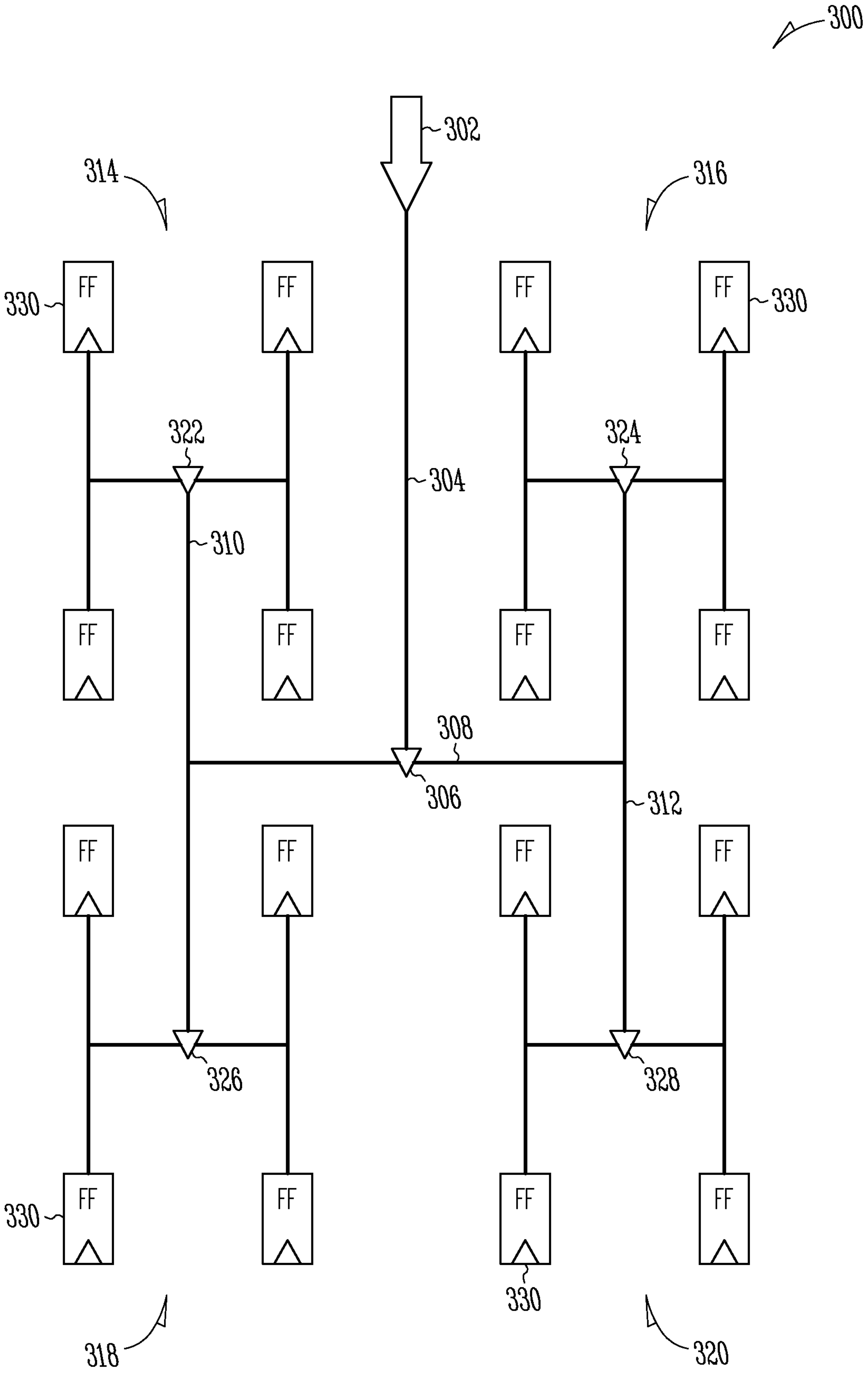
FIG. 3 depicts an example H-tree routing layout, according to some embodiments.

The techniques described herein use an H-tree routing layout 300 (e.g., H-tree routing layout) as shown in FIG. 3 to provide for improved clock signal propagation, minimal (or no skew), and robustness, among other enhancements, when compared to the circuit layout 200, according to some examples. In the depicted example, a clock source 302 is connected to a central trace 304 and in turn the central trace is connected to a buffer 306. The buffer 306 is additionally connected to trace 308, and trace 308 is in turn connected to traces 310 and 312. Traces 308, 310, and 312 form a Latin letter "H" structure, which is electrically connected to other H structures 314, 316, 318, 320, hence the name "H-tree" for the layout 300. In the depicted example, each of the H structures 314, 316, 318, 320 includes a buffer 322, 324, 326, 328, respectively. Each buffer 322, 324, 326, 328 is disposed in a middle section of the H structures 314, 316, 318, 320. More specifically, the buffers 322, 324, 326, 328 are disposed at the intersection of vertical traces with horizontal traces of the H structures 314, 316, 318, 320.

Indeed, all H structures in the H-tree routing layout 300 have a buffer 306, 322, 324, 326, 328 that intersects vertical traces of the structure with horizontal traces in a middle section, thus providing for symmetry and balance. For example, skew is now significantly reduced across corners of the H-tree routing layout 300 due to the symmetric nature of the H-tree routing layout 300. Buffers buffer 306, 322, 324, 326, 328 reduce latency as well as improve on skew. The buffers, also known as line drivers, may come in different sizes based on, for example, distances that a buffer may more efficiently drive a signal. Smaller buffers may be used for shorter distances while larger buffers may be used for larger signals. Each buffer may also include a capacitance and a cost, which can vary according to the buffer size and/or type used.

Clock sinks 330 (e.g., flip-flops or registers) are also shown, disposed as leaves of the H-tree routing layout 300. In use, the clock source 302 provides for a periodic clock signal, which is now more evenly distributed to each of the clock sinks 330 via the symmetric nature of the H-tree routing layout 300 and the use of buffers 306, 322, 324, 326, 328. The clock sinks 330 are connected to one or more sequential components of an IC design being created via the IC design process flow 100. Accordingly, the clock signal is dispersed to sequential components via the H-tree routing layout 300 in a more efficient and balanced manner. However, placement of buffers may be improved by placing multiple buffers at various locations, as shown in the examples of FIG. 4.

Figure 4:
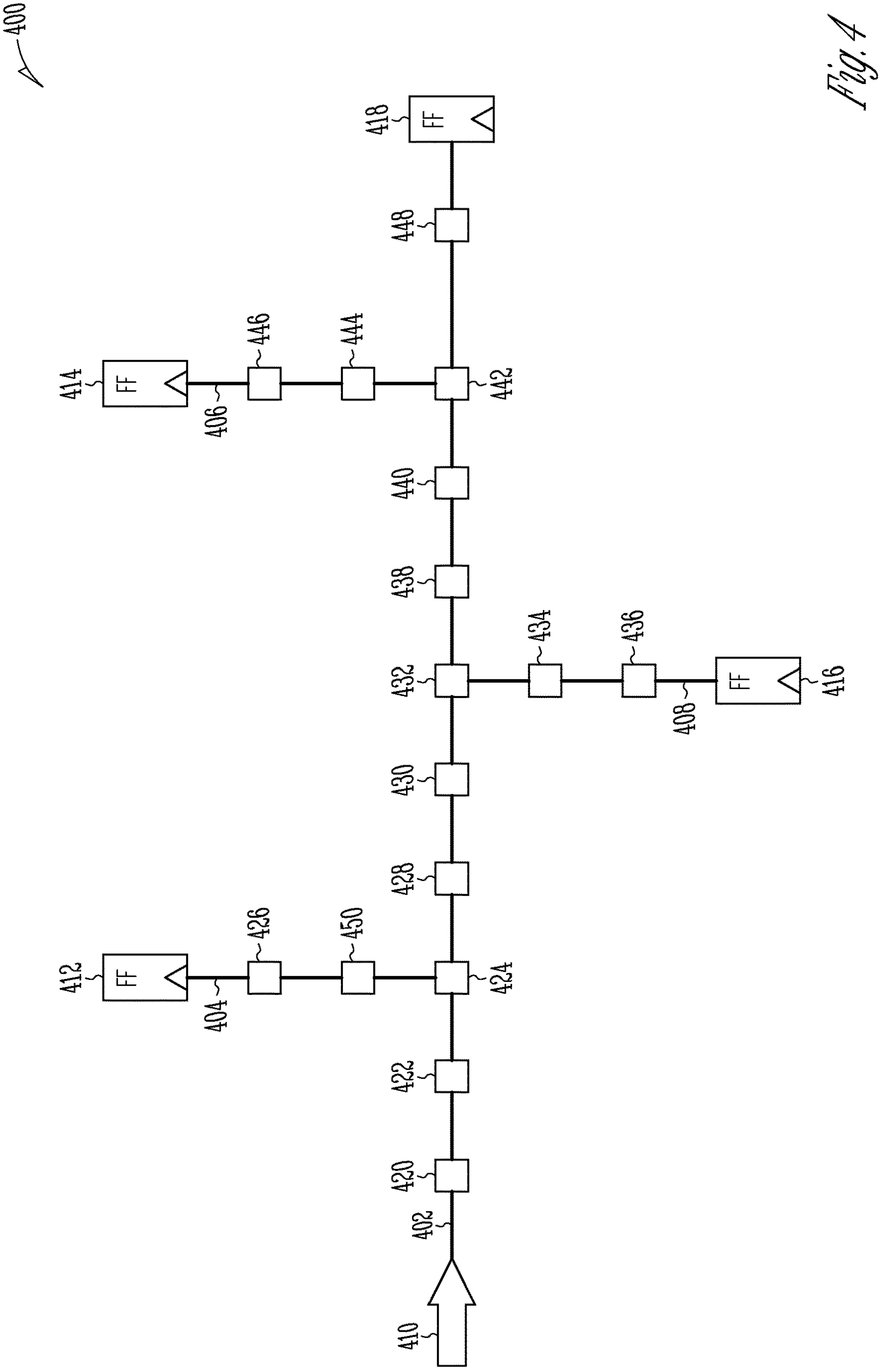
FIG. 4 depicts a section of an example H-tree routing layout, according to some embodiments.

FIG. 4 illustrates an example section 400 of an H-tree routing layout that includes one horizontal trace 402 and three vertical traces 404, 406, 408, according to some examples. In the depicted embodiment, a clock source 410 transmits a clock signal via the trace 402, which then traverses the vertical trace 404 and enters a clock sink 412. The clock signal will also traverse vertical traces 406, 408 and enter clock sinks 414, 416, respectively. The clock signal will also enter a clock sink 418 at an end of the horizontal trace 402 opposite the clock source 410. The clock sinks 412, 414, 416, 418 are flip-flops or registers suitable for further distributing the clock signal, for example, into sequential elements of the IC design.

The figure additionally shows multiple candidate buffers 420-450. The candidate buffers 420-450 can be line drivers that enhance the clock signal's voltage and/or current properties to improve signal transmission. That is, it may be beneficial to add buffers at different locations of the traces 402, 404, 406, 408, for example, to improve a timing between the clock signal and voltage/current seen by the clock sinks 412, 414, 416, 418, invert the clock signal for certain sequential logic elements, enable a branch circuit to drive loads without loss of voltage/current values, and so on. However, adding too many buffers may increase power usage, increase thermal energies of the IC design, and take too much die area. Accordingly, it is beneficial to consider a more optimal number of buffer placement where some of the candidate buffers 420-450 haven been removed using certain buffer insertion balancing techniques described further below, as shown in FIG. 5.

Figure 5:
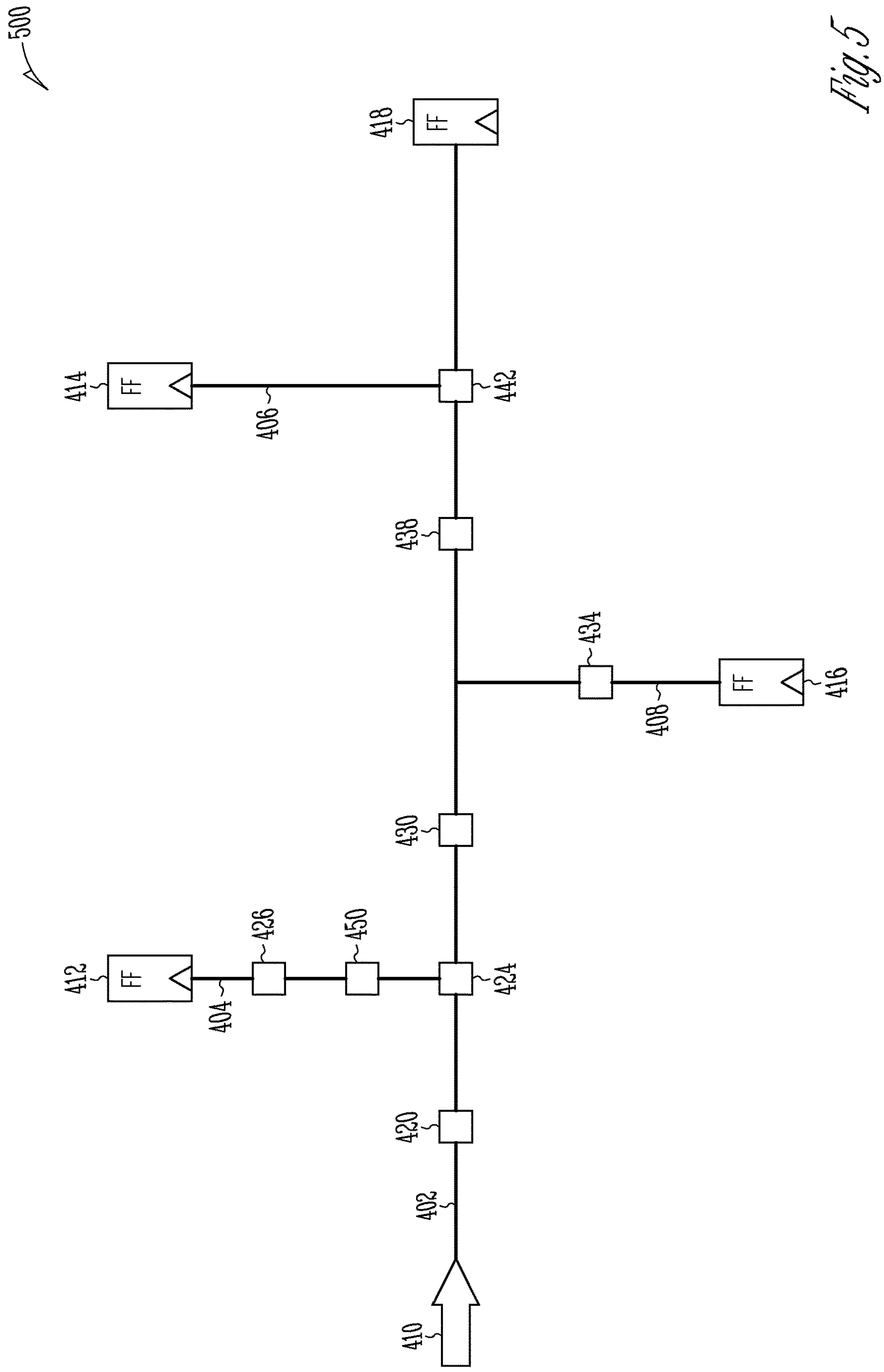
FIG. 5 illustrates the section of the example H-tree routing layout of FIG. 4, with certain candidate buffers removed, according to some embodiments.

FIG. 5 illustrates an example section 500 of an H-tree routing layout based on the section 400 of FIG. 4 where certain candidate buffers have been removed, according to some examples. In the depicted example, candidate buffers 422, 424, 428, 432, 436, 440, 442, 444, 446, 448 have been removed, leaving candidate buffers 420, 426, 430, 434, 438, 450 as the final buffers (and/or inverters) that will be placed in the IC design to provide for a more balanced and efficient set of buffers as compared to placing all of the candidate buffers 420-450 shown in FIG. 4. In the depicted example, each clock sink 412, 414, 416, 418 will have received a clock signal that traverses 3 buffers.

Indeed, the techniques described herein provide for a bottom-up (e.g., from clock sinks to clock source) dynamic programming approach to buffer insertion. In certain examples, each of the candidate buffers 420-450 is disposed throughout the H-tree routing layout and assigned a capacitance value, a timing slack, a cost, and a level (e.g., level in the H-tree). Certain candidate buffers are then "merged", as further described below, so that the remaining candidates (e.g., candidate buffers 420, 426, 430, 434, 438, 450) are then chosen to the final buffers (and/or inverters) used in the IC design. The resulting H-tree routing layout, such as the section 500, can then provide the clock signal incoming from the clock source 410 with minimal (or no) skew, improved robustness, and more efficient power use when compared to the section 400.

Figure 6:
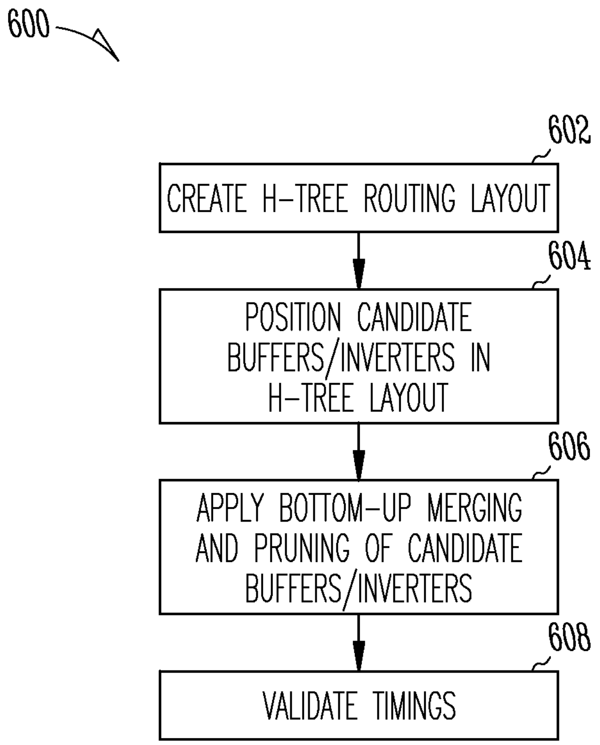
FIG. 6 is a flowchart illustrating an example method for creating an H-tree routing layout and inserting into the H-tree routing layout a more balanced set of buffers and/or inverters, according to some embodiments.

FIG. 6 is a flowchart illustrating an example process 600 used for creating an H-tree routing layout and inserting into the H-tree routing layout a more balanced set of buffers and/or inverters, according to some examples. The process 600 creates, at block 602, an H-tree routing layout, such as the H-tree routing layout 300. Various algorithms can be used to create the H-tree routing layout, including recursive algorithms. For example, an H-tree routing layout can be constructed by starting with a line segment of arbitrary length, drawing two segments of the same length at right angles to the first through the H-tree endpoints, and continuing recursively, reducing (dividing) the length of the line segments drawn at each stage by $\sqrt{2}$.

The process 600 then positions, at block 604, a set of candidate buffers throughout the H-tree routing layout. For example, a candidate buffer may be placed at or near intersection of traces, and other candidate buffers may be placed along traces at certain distances (e.g., fixed distances) from each other. Likewise, the user can modify placement of the buffers in the H-tree routing layout, as well as add and remove candidate buffers. The process 600 then applies, at block 606, a bottom-up merging and pruning of candidate buffers and/or inverters to arrive at a final set of buffers for the IC design being created, e.g., such as the final set of candidate buffers shown in FIG. 5. Further details of a bottom-up merging and pruning process are described below with respect to FIG. 7. It is also to be noted that a user can also manually modify an existing H-tree routing layout by moving nodes and/or traces. In block 608, timings are validated for the candidate buffers. In one example, a CTS timing engine is used to validate, at block 608, that the candidate buffers selected result in target insertion delay being inside of a desired threshold, for example. The CTS timing engine will derive target insertion delay, skew, and other timing values useful in validating that the now pruned candidate buffers will perform as desired.

Figure 7:
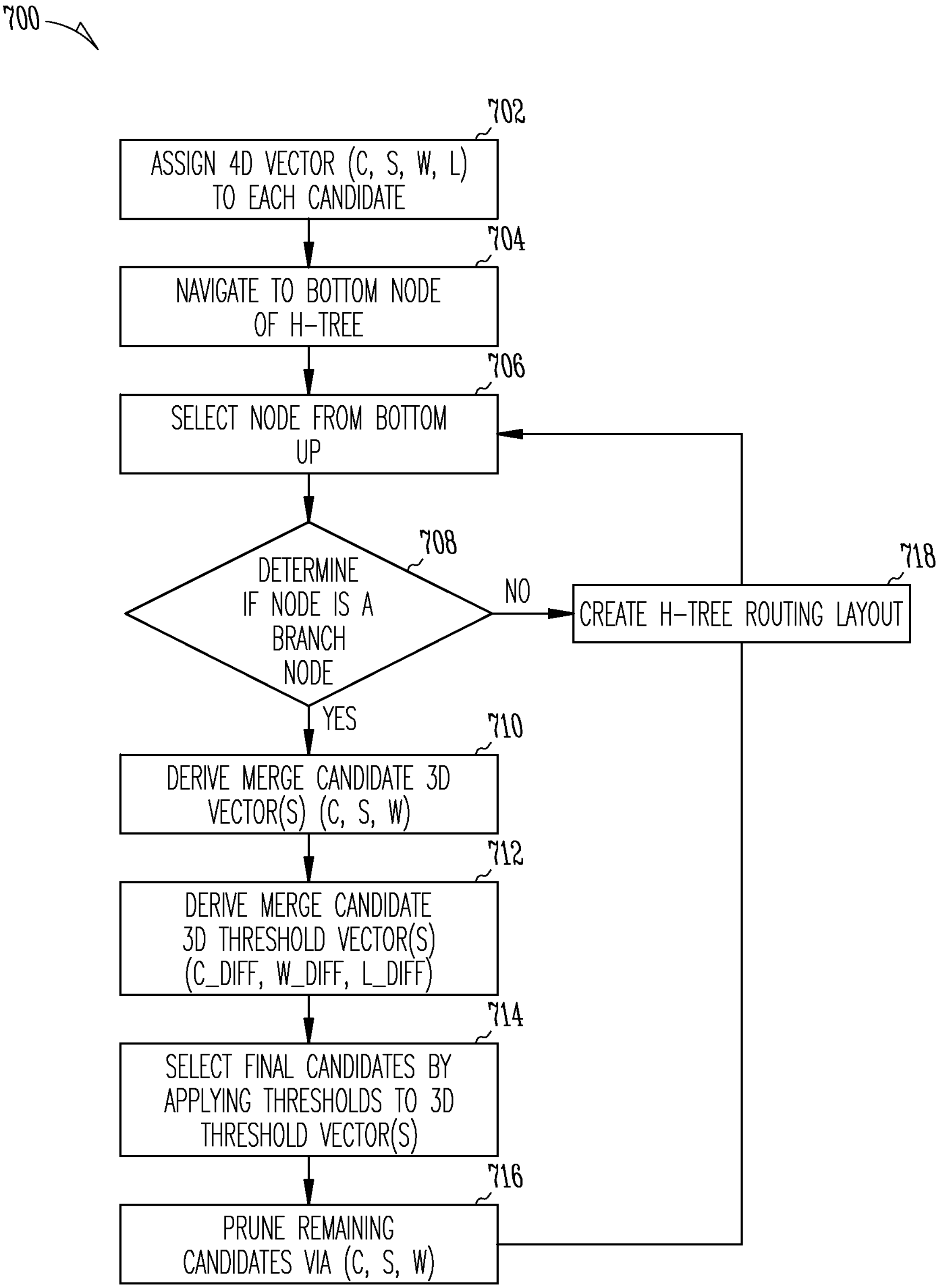
FIG. 7 is a flowchart illustrating an example method for a bottom-up merge and prune of candidate buffers, according to some embodiments.

FIG. 7 is a flowchart depicting an example process 700 for a bottom-up merge and prune of candidate buffers, according to some examples. More specifically, the process 700 is used once an H-tree routing layout is created (e.g., such as via block 602 of FIG. 6), and candidate buffers are then placed (e.g., such as via block 604 of FIG. 6) at various locations of the H-tree routing layout. The process 700 will then merge and prune all of the candidate buffers present in the H-tree routing layout to arrive at a final set of buffers to be used.

In the depicted embodiment, the process 700 assigns, at block 702, a 4-dimensional (4D) vector (C, S, W, L) to each candidate buffer, where C is a capacitance, S is a timing slack, W is a cost, and L is a level in the tree for each candidate buffer. As mentioned earlier, different buffers may have different capacitances. For example, certain buffers may carry a larger downstream capacitance when compared to other buffers, larger buffers may have a larger inherent capacitance compared to smaller buffers, and so on. Timing slack is a margin by which a timing requirement is met or not met. Positive slack indicates the margin by which a requirement is met, and negative slack indicates the margin by which a requirement is not met. Accordingly, timing slack for an individual buffer can vary depending on the position of the buffer from the clock source and/or from nearby buffers. The cost W is based on a size of the buffer, a number of buffers inserted (e.g., some merged candidates are merged as multiple buffers), and so on. As an example for discussion purposes, candidate buffer 444 will be assigned a 4D vector (C, S, W, L) of (2, −10, 8, 3), candidate buffer 446 will be assigned a 4D vector (C, S, W, L) of (2.5, −20, 8, 3), and candidate buffer 448 will be assigned a 4D vector (C, S, W, L) of (4, −15, 6, 3).

The process 700 is a bottom-up process, accordingly the process 700 navigates, at block 704, to a bottom node (e.g., node at level furthers from clock source, such as node 448 in FIG. 4) of the H-tree route and selects, at block 706, a node (e.g., bottom-up selection). The process 700 then determines, at decision 708, if the selected node is a branch node, e.g., (buffers 424, 432, 442 in FIG. 4). If the node is not a branch node, the process 700 updates the C, S, W, L values for the in block 718 as the process 700 selects a next node (e.g., node 442), at block 706, by going "up" the H-tree route, until the selected node is a branch node (e.g., node 442 in FIG. 4). That is, C, S, W, and/or L values for the tree routing layout being processed are updated to reflect the C, S, W, and/or L values as the process 700 navigates the tree routing layout in the bottom-up manner.

The process 700 then derives, at block 710, for candidates at downstream branches of the common branch node, "merge" candidate 3D vector(s) (C, S, W) for a combination of two candidate buffers. A merge candidate 3D vector (C, S, W) merges or combines the C, S, W values from two candidate buffers in downstream branch routes. For example, given 2 candidate buffers C1, C2, disposed on a first downstream branch from a branch node, and 2 candidate buffers C3, C4 disposed on a second downstream branch from the branch node, there are 4 possible combinations [C1 and C3], [C1 and C4], [C2 and C3], and [C2 and C4], that may be used in the final design. Accordingly, for a candidate buffers all disposed on the first downstream branch from a branch node, and b candidate buffers disposed on the second downstream branch from the branch node, there are a total of a×b merge candidate 3D vectors (C, S, W).

In our example, for branch node 442 there are n=2 candidate buffers on the vertical trace 406, and a single candidate/buffer on horizontal trace 402, resulting in the creation of (2×1)=2 merge candidate 3D vectors (C, S, W). As mentioned earlier, for example purposes, candidate buffer 444 is assigned a 4D vector (C, S, W, L) of (2, −10, 8, 3), candidate buffer 446 is assigned a 4D vector (C, S, W, L) of (2.5, −20, 8, 3), and candidate buffer 448 is assigned a 4D vector (C, S, W, L) of (4, −15, 6, 3). A first merge candidate (e.g., merge candidate combination having candidate buffer 444 and candidate buffer 448) will be assigned a first merge candidate 3D vector (C, S, W) having values (6, −20, 14), and a second merge candidate (e.g., merge candidate combination having candidate buffer 446 and candidate buffer 448) will be assigned a second merge candidate 3D vector (C, S, W) of (6.5, −20, 14) at block 710. Each merge candidate 3D vector (C, S, W) is created by adding the capacitances C of both candidate buffers to be merged, by selecting the largest timing slack S between the two candidate buffers to be merged, and adding the costs W for both candidate buffers to be merged.

In certain embodiments, the process 700 would then choose which combinations of candidates to use in the final IC design via the 3D merge vector (C, S, W) such that for candidates having the same or less cost W, candidates with the largest timing slack S and capacitance C are pruned. However, in other balancing embodiments, the process 700 avoids merging candidates having larger capacitance differences via block 714, before pruning. In a balancing example depicted in FIG. 7, the process 700 additionally computes, for each merge candidate combination, a 3D threshold vector (C_diff, W_diff, L_diff). In our example, we have two merge candidate combinations, the first merge candidate combination includes candidate buffer 448 and candidate buffer 444 and the second merge candidate combination includes candidate buffer 448 and candidate buffer 446. Accordingly, two 3D threshold vectors (C_diff, W_diff, L_diff) are derived.

A 3D threshold vector (C_diff, W_diff, L_diff) is derived, at block 712, by computing C_diff, W_diff, and L_diff where C_diff is a difference in capacitance C between the two candidate buffers of the merge candidate combination, W_diff is a difference in cost W between the two candidate buffers, and L_diff is a difference in level L between the two candidate buffers. In our example, a first 3D threshold vector (C_diff, W_diff, L_diff) for the first combination of candidate buffer 448 and candidate buffer 444 is (2, −5, 0), and a second 3D threshold vector (C_diff, W_diff, L_diff) for the second combination candidate buffer 448 and candidate buffer 446 is (1.5, −5, 0).

The process 700 selects, at block 714, final candidates of the merge candidate combinations by applying the 3D threshold vectors (C_diff, W_diff, L_diff) as balancing and robustness filtering vectors. More specifically, the process 700 avoids using merge candidate combinations from across branches that have capacitance C differences over a certain threshold, and then further improves on robustness by adding an extra cost W and level L check. For example, given a capacitance threshold C_threshold, a cost threshold W_threshold, and a level threshold L_threshold, the process 700 will eliminate or filter out, at block 714, merge candidate combinations where, for a given merge candidate combination, a capacitance difference C_diff between the two candidate buffers is equal to or greater than C_threshold. Each merge candidate combination is also eliminated if there is a cost difference W_diff between the two candidate buffers equal to or greater than W_threshold, or if there is a level difference L_diff between the two candidate buffers equal to or greater than L_threshold. Another way of expressing the use of the 3D threshold vector (C_diff, W_diff, L_diff) is that if C_diff<C_threshold and W_diff<W_threshold and L_diff<L_threshold then the merge candidate combination is used, otherwise the merge candidate combination is not used.

As mentioned above, given the branch node 442, there are two possible merge candidate combinations, the first combination having candidate buffer 448 and candidate buffer 444, and the second combination having candidate buffer 448 and candidate buffer 446. Accordingly, there are two 3D threshold vectors (C_diff, W_diff, L_diff), one for each combination. For the aforementioned combinations, the resulting 3D threshold vectors (C_diff, W_diff, L_diff) are (2, −5, 0) for the first combination, and (1.5, −5, 0) for the second combination.

When selecting to use the candidate buffer 448 in combination with candidate buffer 444, versus the candidate buffer 448 in combination with the candidate buffer 446, if the selection was made without applying the 3D threshold vector (C_diff, W_diff, L_diff), buffer candidates of same or higher cost would be found, and those buffer candidates with the shortest timing slack and capacitance would be selected. In this example, candidate buffer 444 would be selected because candidate buffer 444 has a capacitance value of C=2 while candidate buffer 446 has a capacitance value of C=4. The cost W is the same at W=8 for both candidate buffers 444, 446.

However, the process 700 now will consider, at block 714, the 3D threshold vectors (C_diff, W_diff, L_diff), e.g., (2, 2, 0) and (1.5, 2, 0) in our example, for each of the merge candidate combinations, by applying the C_threshold, W_threshold, L_threshold values. If C_threshold is set to a value of less than 2, e.g., 1.75, then candidate buffer 446 will be selected instead of candidate buffer 444 because the C_diff=2 for the merging of candidate buffer 444 with candidate buffer 448 is over the threshold. That is, the 3D threshold vector for each merge candidate/inverter combination is used as filter. Merge candidate/inverter combinations will either pass by having a 3D threshold vector (C_diff, W_diff, L_diff) with values smaller than the thresholds C_threshold, W_threshold, and L_threshold, or not be used in subsequent steps of the process 700. In our example, the candidate buffer 448 in combination with candidate buffer 444 will not pass the filtering due to C_diff being over the C_threshold value. Accordingly, a more balanced H-tree routing layout is achieved due to maintaining smaller capacitance differences between neighboring buffers.

The process 700 will also consider the cost difference and level difference of merge candidate combinations via W_diff and L_diff respectively. In our example, the cost difference and level difference are the same, with values of 2 and 0 respectively, for both combinations (e.g., candidate buffer 448 in combination with candidate buffer 444, and the candidate buffer 448 in combination with the candidate buffer 446). Accordingly, the remaining candidate buffer 448 combination with the candidate buffer 446 is kept since it's W_diff and L_diff pass the desired thresholds. Accordingly, thresholds can now be used during buffer insertion for clock timing, such that cost and levels are also similar between cross-branch candidates, thus improving robustness. It is to be noted that any range of values can be used for the thresholds C_threshold, W_threshold, L_threshold, as desired by the user. Smaller threshold values will result in buffers that are more similar to each other while larger threshold values may provide for more variance amongst buffers when customizing the clock signal path.

The process 700 then prunes, at block 716, any remaining final candidate buffers. In the depicted example, the process 700 uses the 4D vector's C, S, W values assigned at block 702. For example, if multiple merge candidate buffers pass through the C_threshold, W_threshold, L_threshold checks, then some of the candidate buffers may be pruned based on their individual C, S, W values. In certain examples, candidates having the same or larger cost W are found, and those candidates with the largest timing slack S and capacitance C are pruned at block 716. The process 700 then continues iterating up the H-tree routing layout (e.g., towards the clock source) by selecting the next node from bottom up at block 706, until all nodes have been visited. By applying the capacitance, cost, and level thresholds, a more balanced and robust H-tree routing layout is provided.

Although the described flowcharts can show operations as a sequential process, many of the operations can be performed in parallel or concurrently. In addition, the order of the operations may be re-arranged. A process is terminated when its operations are completed. A process may correspond to a method, a procedure, an algorithm, etc. The operations of methods may be performed in whole or in part, may be performed in conjunction with some or all of the operations in other methods, and may be performed by any number of different systems, such as the systems described herein, or any portion thereof, such as a processor included in any of the systems.

Figure 8:
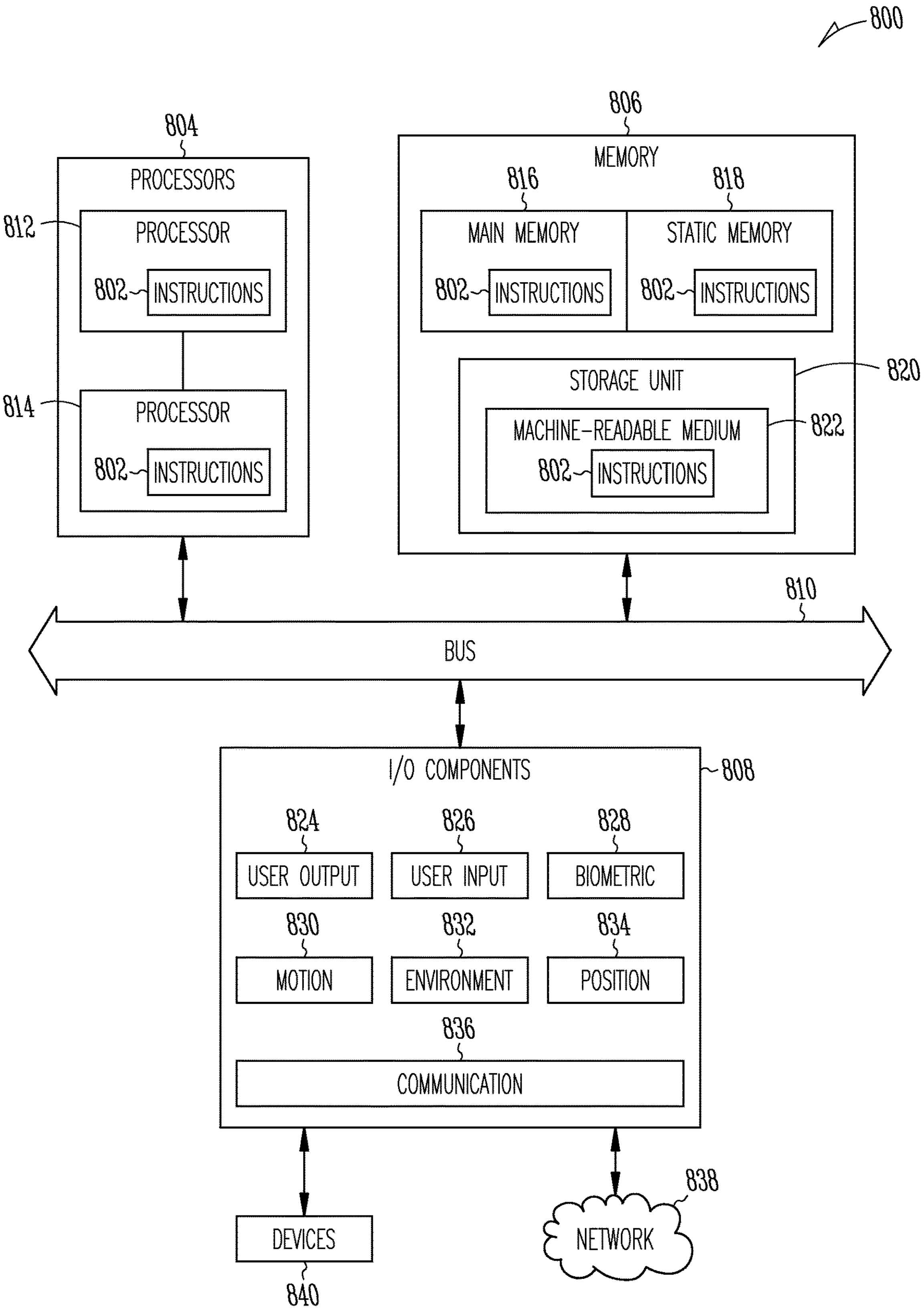
FIG. 8 is a block diagram depicting a machine suitable for executing instructions via one or more processors, according to some embodiments.

FIG. 8 is a diagrammatic representation of a machine 800 within which instructions 802 (e.g., software, a program, an application, an applet, an app, or other executable code) for causing the machine 800 to perform any one or more of the methodologies discussed herein may be executed. For example, the instructions 802 may cause the machine 800 to execute any one or more of the processes or methods described herein, such as the processes 600 and 700. The instructions 802 transform the general, non-programmed machine 800 into a particular machine 800 programmed to carry out the described and illustrated functions in the manner described. The machine 800 may operate as a standalone device or may be coupled (e.g., networked) to other machines. In a networked deployment, the machine 800 may operate in the capacity of a server machine or a client machine in a server-client network environment, or as a peer machine in a peer-to-peer (or distributed) network environment. The machine 800 may comprise, but not be limited to, a server computer, a client computer, a personal computer (PC), a tablet computer, a laptop computer, a netbook, a set-top box (STB), a personal digital assistant (PDA), an entertainment media system, a cellular telephone, a smartphone, a mobile device, a wearable device (e.g., a smartwatch), a smart home device (e.g., a smart appliance), other smart devices, a web appliance, a network router, a network switch, a network bridge, or any machine capable of executing the instructions 802, sequentially or otherwise, that specify actions to be taken by the machine 800. Further, while a single machine 800 is illustrated, the term "machine" shall also be taken to include a collection of machines that individually or jointly execute the instructions 802 to perform any one or more of the methodologies discussed herein. In some examples, the machine 800 may also comprise both client and server systems, with certain operations of a particular method or algorithm being performed on the server-side and with certain operations of the particular method or algorithm being performed on the client-side.

The machine 800 may include processors 804, memory 806, and input/output I/O components 808, which may be configured to communicate with each other via a bus 810. In an example, the processors 804 (e.g., a Central Processing Unit (CPU), a Reduced Instruction Set Computing (RISC) Processor, a Complex Instruction Set Computing (CISC) Processor, a Graphics Processing Unit (GPU), a Digital Signal Processor (DSP), an Application-Specific Integrated Circuit (ASIC), a Radio-Frequency Integrated Circuit (RFIC), another processor, or any suitable combination thereof) may include, for example, a processor 812 and a processor 814 that execute the instructions 802. The term "processor" is intended to include multi-core processors that may comprise two or more independent processors (sometimes referred to as "cores") that may execute instructions contemporaneously. Although FIG. 8 shows multiple processors 804, the machine 800 may include a single processor with a single-core, a single processor with multiple cores (e.g., a multi-core processor), multiple processors with a single core, multiple processors with multiples cores, or any combination thereof.

The memory 806 includes a main memory 816, a static memory 818, and a storage unit 820, both accessible to the processors 804 via the bus 810. The main memory 816, the static memory 818, and storage unit 820 store the instructions 802 embodying any one or more of the methodologies or functions described herein. The instructions 802 may also reside, completely or partially, within the main memory 816, within the static memory 818, within machine-readable medium 822 within the storage unit 820, within at least one of the processors 804 (e.g., within the processor's cache memory), or any suitable combination thereof, during execution thereof by the machine 800.

The I/O components 808 may include a wide variety of components to receive input, provide output, produce output, transmit information, exchange information, capture measurements, and so on. The specific I/O components 808 that are included in a particular machine will depend on the type of machine. For example, portable machines such as mobile phones may include a touch input device or other such input mechanisms, while a headless server machine will likely not include such a touch input device. It will be appreciated that the I/O components 808 may include many other components that are not shown in FIG. 8. In various examples, the I/O components 808 may include user output components 824 and user input components 826. The user output components 824 may include visual components (e.g., a display such as a plasma display panel (PDP), a light-emitting diode (LED) display, a liquid crystal display (LCD), a projector, or a cathode ray tube (CRT)), acoustic components (e.g., speakers), haptic components (e.g., a vibratory motor, resistance mechanisms), other signal generators, and so forth. The user input components 826 may include alphanumeric input components (e.g., a keyboard, a touch screen configured to receive alphanumeric input, a photo-optical keyboard, or other alphanumeric input components), point-based input components (e.g., a mouse, a touchpad, a trackball, a joystick, a motion sensor, or another pointing instrument), tactile input components (e.g., a physical button, a touch screen that provides location and force of touches or touch gestures, or other tactile input components), audio input components (e.g., a microphone), and the like.

In further examples, the I/O components 808 may include biometric components 828, motion components 830, environmental components 832, or position components 834, among a wide array of other components. For example, the biometric components 828 include components to detect expressions (e.g., hand expressions, facial expressions, vocal expressions, body gestures, or eye-tracking), measure biosignals (e.g., blood pressure, heart rate, body temperature, perspiration, or brain waves), identify a person (e.g., voice identification, retinal identification, facial identification, fingerprint identification, or electroencephalogram-based identification), and the like. The motion components 830 include acceleration sensor components (e.g., accelerometer), gravitation sensor components, rotation sensor components (e.g., gyroscope).

The environmental components 832 include, for example, one or cameras (with still image/photograph and video capabilities), illumination sensor components (e.g., photometer), temperature sensor components (e.g., one or more thermometers that detect ambient temperature), humidity sensor components, pressure sensor components (e.g., barometer), acoustic sensor components (e.g., one or more microphones that detect background noise), proximity sensor components (e.g., infrared sensors that detect nearby objects), gas sensors (e.g., gas detection sensors to detection concentrations of hazardous gases for safety or to measure pollutants in the atmosphere), or other components that may provide indications, measurements, or signals corresponding to a surrounding physical environment. The position components 834 include location sensor components (e.g., a global positioning system (GPS) receiver component), altitude sensor components (e.g., altimeters or barometers that detect air pressure from which altitude may be derived), orientation sensor components (e.g., magnetometers), and the like.

Communication may be implemented using a wide variety of technologies. The I/O components 808 further include communication components 836 operable to couple the machine 800 to a network 838 or devices 840 via respective coupling or connections. For example, the communication components 836 may include a network interface component or another suitable device to interface with the network 838. In further examples, the communication components 836 may include wired communication components, wireless communication components, cellular communication components, Near Field Communication (NFC) components, Bluetooth® components (e.g., Bluetooth® Low Energy), Wi-Fi® components, and other communication components to provide communication via other modalities. The devices 840 may be another machine or any of a wide variety of peripheral devices (e.g., workstation, a laptop, a tablet, a mobile phone, a smart watch, a peripheral device coupled via a universal serial bus (USB) port), internet-of-things (IoT) devices, and the like.

Moreover, the communication components 836 may detect identifiers or include components operable to detect identifiers. For example, the communication components 836 may include Radio Frequency Identification (RFID) tag reader components, NFC smart tag detection components, optical reader components (e.g., an optical sensor to detect one-dimensional bar codes such as Universal Product Code (UPC) bar code, multi-dimensional bar codes such as Quick Response (QR) code, Aztec code, Data Matrix, Dataglyph, MaxiCode, PDF417, Ultra Code, UCC RSS-2D bar code, and other optical codes), or acoustic detection components (e.g., microphones to identify tagged audio signals). In addition, a variety of information may be derived via the communication components 836, such as location via Internet Protocol (IP) geolocation, location via Wi-Fi® signal triangulation, location via detecting an NFC beacon signal that may indicate a particular location, and so forth.

The various memories (e.g., main memory 816, static memory 818, and memory of the processors 804) and storage unit 820 may store one or more sets of instructions and data structures (e.g., software) embodying or used by any one or more of the methodologies or functions described herein. These instructions (e.g., the instructions 802), when executed by processors 804, cause various operations to implement the disclosed examples.

The instructions 802 may be transmitted or received over the network 838, using a transmission medium, via a network interface device (e.g., a network interface component included in the communication components 836) and using any one of several well-known transfer protocols (e.g., hypertext transfer protocol (HTTP)). Similarly, the instructions 802 may be transmitted or received using a transmission medium via a coupling (e.g., a peer-to-peer coupling) to the devices 840.

A cloud deployment and/or cloud computing is supported by having certain components of the machine 800, e.g., processors 804, memory 806, bus 810, and/or I/O components 808 included in a cloud environment and used via cloud-based techniques. For example, certain components of the machine 808 may be disposed in cloud server facilities and communicatively coupled to client devices 840 to execute the process flow 100 or portions of the process flow 100 in the cloud. Accordingly, processes, such as process 600 and/or 700, can be cloud-based processes executable in the cloud.

The techniques described herein provide for a more balanced H-tree routing layout that includes buffers sharing a common branch node having closer capacitance values, similar cost (e.g., complexity), and share similar tree levels. The techniques described herein include a buffer insertion and pruning process that various 4D and 3D vectors to arrive at the more balanced H-tree routing layout. For example, 3D merge vectors and threshold vectors are used to remove certain buffers. The remaining buffers then provide for improved timing with more balanced and robust properties.

What is claimed is:

1. A method for clock tree synthesis, comprising:

creating an H-tree routing layout that comprises a plurality of vertical traces and horizontal traces connecting a clock source to a plurality of clock sinks;

inserting a plurality of candidate buffers in the H-tree routing layout;

assigning a 4-dimensional (4D) vector to each candidate buffer of the plurality of candidate buffers;

deriving one or more merge buffer combinations from the plurality of candidate buffers based on the 4D vector of at least two candidate buffers of the plurality of candidate buffers; and selecting one or more final candidate buffers from the merge buffer combinations based on a threshold vector.

2. The method of claim 1, wherein the 4D vector for each candidate buffer is defined by values C, S, V, and L, wherein C is capacitance, S is timing slack, W is cost, and L is a level in the H-tree routing layout.

3. The method of claim 2, wherein deriving the one or more merge buffer combinations comprises creating a merge buffer combination by combining a first candidate buffer of the plurality of candidate buffers with a second candidate buffer of the plurality of candidate buffers to derive a 3-dimensional (3D) merge candidate vector defined by values C, S, and W based on a first 4D vector for the first candidate buffer and a second 4D vector for the second candidate buffer.

4. The method of claim 3, wherein C of the 3D merge candidate vector is derived by adding a first capacitance of the first candidate buffer with a second capacitance of the second candidate buffer, S of the 3D merge candidate vector is derived by selecting a first timing slack of the first candidate buffer or a second timing slack of the second candidate buffer that has a largest timing slack value, and W of the 3D merge candidate vector is derived by adding a first cost of the first candidate buffer to a second cost of the second candidate buffer.

5. The method of claim 4, wherein applying the threshold vector comprises deriving a 3D threshold vector defined by values C_diff, W_diff, and L_diff, wherein C_diff is a capacitance difference between the first capacitance of the first candidate buffer and the second capacitance of the second candidate buffer, W_diff is a cost difference between the first cost of the first candidate buffer and the second cost of the second candidate buffer, and L_diff is a level difference between a first level in the H-tree routing layout of the first candidate buffer and a second level in the H-tree routing layout of the second candidate buffer.

6. The method of claim 5, wherein applying the threshold vector comprises comparing C_diff against a capacitance threshold value and discarding the merge buffer combination if C_diff is equal to or greater than the capacitance threshold value.

7. The method of claim 6, wherein applying the threshold vector comprises:

comparing W_diff against a cost threshold value, comparing L_diff against a level threshold value; and discarding the merge buffer combination if C_diff is equal to or greater than the capacitance threshold value, if W_diff is equal to or greater than the cost threshold value, or if L_diff is equal to or greater than the level threshold value.

8. The method of claim 7, wherein a lowest level of the H-tree routing layout comprises a clock sink of the plurality of clock sinks.

9. The method of claim 3, wherein the first candidate buffer is disposed on a first branch of the H-tree routing layout, wherein the second candidate buffer is disposed on a second branch of the H-tree routing layout, and wherein the first branch is operatively coupled to the second branch via a common branch node.

10. The method of claim 9, comprising navigating to the common branch node via bottom-up navigation to deriving the one or more merge buffer combinations.

11. The method of claim 10, comprising starting the bottom-up navigation at a lowest level of the H-tree routing layout.

12. The method of claim 2, comprising pruning the plurality of candidate buffers after applying the threshold vector by discarding a set of the final candidate buffers via the C, S, and W values of the 4D vector of each of the final candidate buffers.

13. The method of claim 12, wherein discarding the set of the final candidate buffers comprises finding final candidate buffers that have same or more W values and discarding found final candidate buffers that have larger S or larger C values, wherein the discarded set comprises the discarded found final candidate buffers.

14. The method of claim 13, comprising assigning the final candidate buffers that have not been discarded as the candidate buffers to be placed in the H-tree routing layout during manufacturing of a clock signal network comprising the H-tree routing layout.

15. A non-transitory, computer storage medium storing instructions, which when executed by a machine, cause the machine to perform operations comprising:

creating an H-tree routing layout, wherein the H-tree routing layout comprises a plurality of vertical traces and horizontal traces connecting a clock source to a plurality of clock sinks;

positioning a plurality of candidate buffers in the H-tree routing layout;

assigning a 4-dimensional (4D) vector to each candidate buffer of the plurality of candidate buffers;

deriving one or more merge buffer combinations from the plurality of candidate buffers based on the assigned 4D vector of at least two candidate buffers of the plurality of candidate buffers; and applying a threshold vector to select one or more final candidate buffers from the merge buffer combinations.

16. The non-transitory, computer storage medium of claim 15, comprising instructions, which when executed by the machine, cause the machine to perform operations comprising pruning the final candidate buffers by discarding a set of the final candidate buffers via the 4D vector of each of the final candidate buffers.

17. The non-transitory, computer storage medium of claim 16, wherein the 4D vector of each of the final candidate buffer comprises (C, S, W, L), wherein C is capacitance, S is timing slack, W is cost, and L is a level in the H-tree.

18. The non-transitory, computer storage medium of claim 16, wherein a merge buffer combination of the one or more merge buffer combinations comprises a first candidate buffer of the at least two candidate buffers and a second candidate buffer of the at least two candidate buffers, and wherein applying the threshold vector comprises:

deriving a 3-dimensional (3D) threshold vector defined by values C_diff, W_diff, L_diff, wherein C_diff is a capacitance difference between a first capacitance of the first candidate buffer and a second capacitance of the second candidate buffer, W_diff is a cost difference between a first cost of the first candidate buffer and a second cost of the second candidate buffer, and L_diff is a level difference between a first level in the H-tree routing layout of the first candidate buffer and a second level in the H-tree routing layout of the second candidate buffer;

comparing C_diff against a capacitance threshold value, comparing W_diff against a cost threshold value, and comparing L_diff against a level threshold value; and discarding the merge buffer combination if C_diff is equal to or greater than the capacitance threshold value, if W_diff is equal to or greater than the cost threshold value, or if L_diff is equal to or greater than the level threshold value.

19. A system, comprising:

one or more processors of a computing machine; and a computer storage medium storing instructions, which when executed by the computing machine, cause the computing machine to perform operations comprising:

creating an H-tree routing layout that comprises a plurality of vertical traces and horizontal traces connecting a clock source to a plurality of clock sinks;

inserting a plurality of candidate buffers in the H-tree routing layout;

assigning a 4-dimensional (4D) vector to each candidate buffer of the plurality of candidate buffers;

deriving one or more merge buffer combinations from the plurality of candidate buffers based on the 4D vector of at least two candidate buffers of the plurality of candidate buffers; and selecting one or more final candidate buffers from the merge buffer combinations based on a threshold vector.

20. The system of claim 19, wherein a merge buffer combination of the one or more merge buffer combinations comprises a first candidate buffer of the at least two candidate buffers and a second candidate buffer of the at least two candidate buffers, and wherein applying the threshold vector comprises:

deriving a 3-dimensional (3D) threshold vector defined by values C_diff, W_diff, and L_diff, wherein C_diff is a capacitance difference between a first capacitance of the first candidate buffer and a second capacitance of the second candidate buffer, W_diff is a cost difference between a first cost of the first candidate buffer and a second cost of the second candidate buffer, and L_diff is a level difference between a first level in the H-tree routing layout of the first candidate buffer and a second level in the H-tree routing layout of the second candidate buffer;

comparing C_diff against a capacitance threshold value, comparing W_diff against a cost threshold value, and comparing L_diff against a level threshold value; and discarding the merge buffer combination if C_diff is equal to or greater than the capacitance threshold value, if W_diff is equal to or greater than the cost threshold value, or if L_diff is equal to or greater than the level threshold value.

* * * * *